United States Patent [19]

Willis et al.

[11] Patent Number: 4,543,599
[45] Date of Patent: Sep. 24, 1985

[54] ANALOG-TO-DIGITAL CONVERSION APPARATUS INCLUDING DOUBLE DITHER SIGNAL SOURCES

[75] Inventors: Donald H. Willis, Indianapolis; Russell T. Fling, Noblesville, both of Ind.

[73] Assignee: RCA Corporation, Princeton, N.J.

[21] Appl. No.: 498,136

[22] Filed: May 25, 1983

[51] Int. Cl.⁴ .............................................. H04N 9/32
[52] U.S. Cl. ..................................................... 358/13
[58] Field of Search .................... 358/13, 36, 23, 21 R

[56] References Cited

U.S. PATENT DOCUMENTS

| | | | |
|---|---|---|---|
| 3,656,152 | 4/1972 | Gunderson | 340/347 AD |
| 3,739,082 | 6/1973 | Lippel | 358/138 X |
| 3,877,022 | 4/1975 | Lehman et al. | 340/347 AD |
| 3,953,668 | 4/1976 | Judice | 358/160 X |
| 4,244,004 | 1/1981 | Yamada | 358/138 |
| 4,275,411 | 6/1981 | Lippel | 358/13 |
| 4,334,237 | 6/1982 | Reitmeier et al. | 358/36 |
| 4,352,123 | 9/1982 | Flamm | 358/23 |
| 4,460,924 | 7/1984 | Lippel | 358/13 X |

FOREIGN PATENT DOCUMENTS

| | | |
|---|---|---|
| 0037259 | 10/1981 | European Pat. Off. |
| 57-50181 | 3/1982 | Japan |
| 1483383 | 8/1977 | United Kingdom |
| 1535219 | 12/1978 | United Kingdom |
| 2004150A | 3/1979 | United Kingdom |
| 2067373A | 7/1981 | United Kingdom |

OTHER PUBLICATIONS

R. H. Stafford, "Bandwidth Reduction and Communication Aspects", *Digital Television*, pp. 50–51.
A. Goldberg, "PCM Encoded NTSC Color Television Subjective Tests", *Journal of the SMPTE*, vol. 82, Aug. 1973, pp. 649–654.
V. Devereux, "Application of PCM to Broadcast Quality Video Signals", *The Radio and Electronic Engineer*, vol. 44, No. 7, 7/74, pp. 373–378.
ITT Semiconductors, *VLSI Digital TV System DIGIT 2000*, Aug. 1982.

Primary Examiner—John C. Martin
Assistant Examiner—Michael P. Dunnam
Attorney, Agent, or Firm—E. M. Whitacre; P. J. Rasmussen; C. A. Berard, Jr.

[57] ABSTRACT

Digital representations of analog signals are limited in resolution accuracy by the number of bits in the digital output signal of an analog-to-digital converter which limits the number of analog output levels produceable by a digital-to-analog converter. The apparent resolution accuracy can be improved, however, by the addition of two "dithering" signals, one at a lower frequency and one at a higher frequency, to increase the number of transitions of the least significant bit (LSB) of the digital signals. In a television receiver employing digital signal processing apparatus, dither signals having magnitudes equivalent to ½ and ¼ LSB and at frequencies related to the TV line frequency and the color subcarrier frequency are preferred.

6 Claims, 6 Drawing Figures

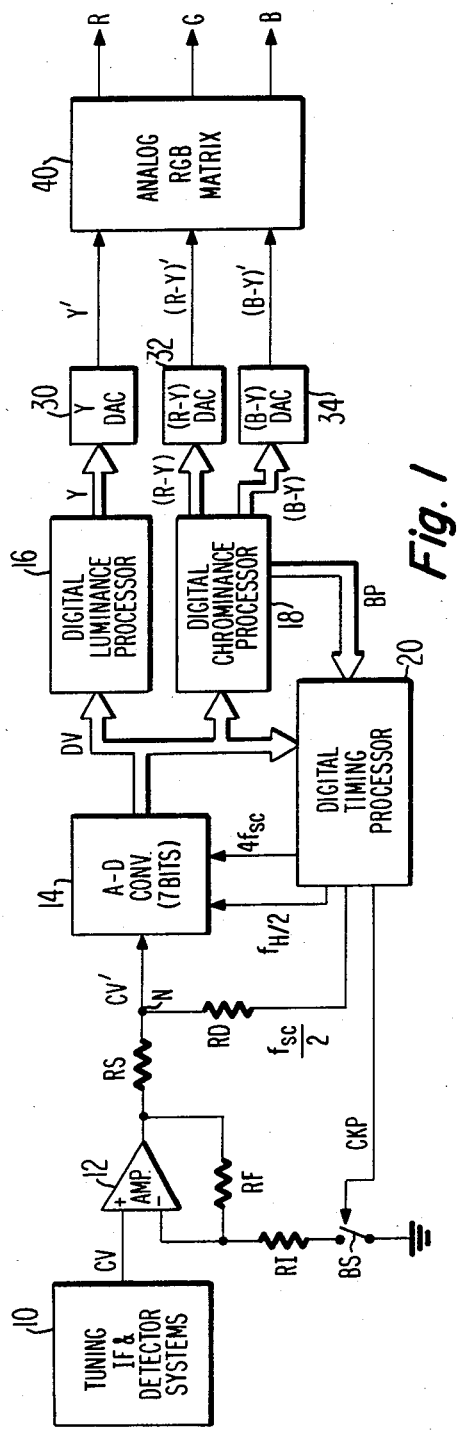
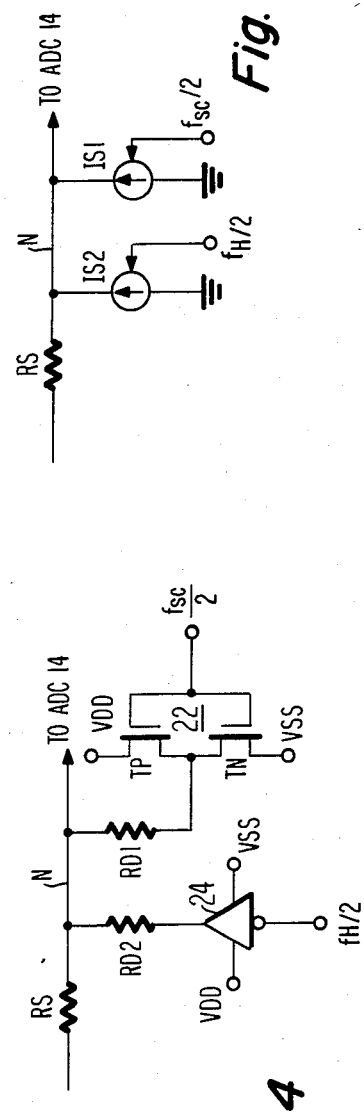

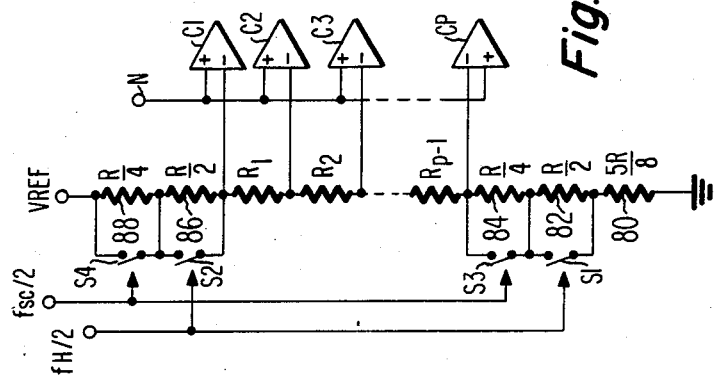
Fig. 6
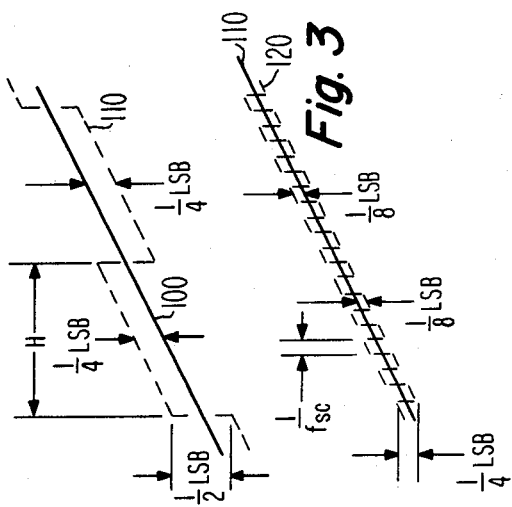
Fig. 2
Fig. 3

ANALOG-TO-DIGITAL CONVERSION APPARATUS INCLUDING DOUBLE DITHER SIGNAL SOURCES

The present invention relates to analog-to-digital conversion apparatus and particularly to such apparatus including two sources of dithering signals. The present invention is advantageously employed in a television receiver including digital signal processing of video signals.

Analog-to-digital converters (ADC) become more difficult to construct as the number of bits of resolution is increased and as the rate at which conversions are performed is increased. Obviously, the problem is compounded when high resolution and high conversion rate are both desired. This problem is very real with respect to digital signal processing of television (TV) signals in a TV receiver wherein eight-bit resolution and 14–18 MegaHertz conversion rates are desired. Although a few ADCs meeting these performance requirements are commerically available, they are not suitable for use in a mass-produced consumer product such as a TV receiver because they are prohibitively expensive. Specifically, the piece-part cost of such ADC alone is comparable to the retail price of an entire conventional TV receiver.

Consequently, presently practical digital signal processing arrangements for TV receivers employ ADCs which have fewer bits of resolution than the eight-bit resolution which is desired. One technique for increasing the apparent resolution of such apparatus is to include a small disturbance signal, called a dither signal, to cause extra transitions of the lesser significant bits of the digital signals developed by the ADC. An ADC having dither is described in U.S. Pat. No. 4,352,123, for example. As a result of an averaging operation, preferably located at a point near the output of the signal processing apparatus, the apparent increase in resolution is preserved in the analog signals developed by a digital-to-analog converter subsequent to the digital signal processing arrangement. In a TV receiver such averaging can be provided by the persistence of the phosphors of the kinescope, the eye of the viewer, or an electrical filter. Apparatus having an offsetting signal providing dither and having logic for averaging picture information is described in U.S. Pat. No. 4,334,237, for example.

Applicants have observed that a conventional dithering arrangement, although providing some improvement, is inadequate to render artifacts in a TV picture unobservable. This problem is particularly noticeable for blue color picture areas and for conditions where the colors are subdued in a relatively bright scene (i.e. where the ratio of the magnitude of the chrominance signals to that of the luminance signals is low). Applicants have discovered an arrangement of plural dithering signals which markedly improves the apparent quantizing resolution yet is relatively simple, inexpensive and reliable.

Accordingly, the analog-to-digital converter apparatus of the present invention comprises a converting device developing digital samples representing the magnitude of an analog signal, and first and second devices changing the magnitudes of ones of the analog signals and a reference signal at first and second respective periodic rates and by first and second respective amounts.

In the Drawing:

FIG. 1 is a schematic diagram, partially in block diagram form, of an arrangement including an exemplary embodiment of the present invention;

FIGS. 2 and 3 illustrate signal waveforms helpful in understanding the operation of the present invention; and FIGS. 4, 5 and 6 are schematic diagrams of alternative exemplary embodiments of portions of the arrangement of FIG. 1.

In the drawings, single-line arrows represent signal paths for analog signals or single-bit digital signals, and broad arrows represent signal paths for multiple-bit parallel digital signals.

In the TV receiver shown in FIG. 1, apparatus 10 includes a tuning system to receive TV signals and translate them to intermediate frequency (IF) signals, an IF system to amplify and shape the frequency spectrum of the IF signals, and a detector system to develop baseband analog composite video signals CV from the IF signals, all in conventional fashion. Composite video signals CV have a TV horizontal line rate associated therewith and include image and non-image intervals within each line duration. The non-image intervals include a synchronization pulse and a color subcarrier reference burst signal, for synchronizing the deflection and chrominance processors of the TV receiver.

Video buffer amplifier 12 couples analog composite video signals CV to analog-to-digital converter (ADC) 14 and provides proper matching and sufficient signal drive levels. Video amplifier 12 is a unity-gain non-inverting amplifier having feedback resistor RF connected between its output and inverting input terminals. Video amplifier 12 includes a feature provided by burst switch BS modifying signals CV by increasing the amplitude of the color subcarrier reference burst signal. Burst switch BS closes in response to color key pulse CKP, which is coincident in time with at least the color subcarrier reference burst signal, to connect resistor RI between the inverting input of amplifier 12 and ground. The voltage gain of amplifier 12 when BS is closed increases to $1+(RF/RI)$ during pule CKP. It is satisfactory that RF and RI have equal resistance values to produce a voltage gain of two times. The modified composite video signals CV' are coupled to ADC 14 via resistor RS and node N. RS can be a separate resistor, the output impedance of amplifier 12, or a combination thereof.

Analog-to-digital converter (ADC) 14 develops seven-bit digital samples DV having magnitudes representative of the magnitudes of samples of modified composite video signals CV' at node N. ADC 14 performs conversions at a rate controlled by sampling signals $4f_{sc}$ which are developed by processor 20 at four times the frequency $f_{sc}$ of the color subcarrier reference burst signal and in phase lock therewith. ADC 14 receives clocking signal $f_H/2$ developed by processor 20 at a frequency of one-half the horizontal line rate. ADC 14 modifies the correspondence between the magnitudes of analog composite video signals CV and digital signals DV by a small amount, preferably equal to one-half the magnitude represented by the least significant bit (LSB) of digital samples DV. Thus, a periodic dither of one-half LSB at one-half the line rate is introduced.

FIG. 2 illustrates a portion 100 of modified analog composite video signal CV' further modified by the ½ LSB dither signal at the frequency $f_H/2$. The peak-to-peak magnitude of this dither signal is ½ LSB and is preferably introduced to modify signal portion 100 by effectively increasing its magnitude by ¼LSB during one TV line duration H and by effectively decreasing it by ¼ LSB during the next TV line duration. This is illustrated by signal waveform 110 shown in phantom. As a result, the seven-bit digital samples DV include additional transitions representative of ½ LSB magnitude changes which can be averaged so as to produce an apparent quantizing resolution approximating that of an eight-bit ADC.

Seven-bit digital video samples DV are applied to digital luminance processor 16 which performs operations such as filtering out the chrominance components to produce the luminance signals, peaking the digital luminance signals and multiplying the digital luminance signals to adjust the contrast level of the resulting picture. Processor 16 produces processed seven-bit digital luminance signals Y which are converted into corresponding analog luminance Y' by digital-to-analog converter (DAC) 30.

Seven-bit digital video samples DV are applied to digital chrominance processor 18 which performs operations such as band-pass filtering to separate the chrominance component signals, automatic chrominance controlling to standardize the magnitude of the chrominance subcarrier signals, demodulating the (B-Y) and (R-Y) chrominance component signals and adjusting the magnitudes thereof to control saturation (color intensity) and hue (tint). The resulting digital chrominance component signals (B-Y) and (R-Y) are applied to DACs 32 and 34, respectively, which produce analog chrominance component signals (B-Y)' and (R-Y)', respectively. In addition, processor 18 detects the phase error between sampling signal $4f_{sc}$ and the color subcarrier reference burst signal component of the digital samples to produce color reference burst phase error signals BP which are employed by timing processor 20 described below.

Analog RGB matrix 40 receives analog luminance signals Y' and anlog chrominance signals (B-Y)' and (R-Y)' to develop therefrom analog color drive signals R, G and B in accordance with the color balance equations of, for example, the NTSC system in the United States. Drive signals R,G,B are applied to a kinescope (not shown) to create a color picture display thereon.

Seven-bit digital samples DV are applied to digital timing processor 20 which develops the various clock and timing signals required to operate ADC 14, processors 16 and 18, and DACs 30, 32 and 34. Processor 20 includes, for example, a phase-locked loop having a voltage-controlled oscillator operating at the frequency of sampling signal $4f_{sc}$ and responsive to the burst phase error signal BP supplied by chrominance processor 14. A digital divide-by-eight circuit produces clocking signal $f_{sc}/2$ therefrom. Processor 20 is further responsive to the horizontal synchronization pulse represented in digital samples DV to develop color key pulse CKP and a clocking signal at the horizontal line rate $f_H$. A digital divide-by-two circuit produces clocking signal $f_H/2$ therefrom.

Clocking signal $f_{sc}/2$ is coupled to node N by resistor RD to develop a second dithering signal further modifying the composite video signal CV' applied to ADC 14. This is done, for example, by adding the dithering signal to signal CV' at node N. The resistance of RD is selected to cooperate with resistor RS to produce a dither voltage at node N which further alters the correspondence between the magnitudes of analog composite video signals CV and digital signals DV by a second small amount. Preferably, this second amount is equal to one-quarter the magnitude represented by the LSB of digital samples DV. Thus, a periodic dither magnitude equivalent to one-quarter LSB at a frequency related to the color subcarrier frequency $f_{sc}$ is introduced. The resistance of RD is also much greater than that of RS so that the voltage divider formed thereby does not significantly attenuate analog signals CV.

FIG. 3 illustrates a portion 110 of composite video signal CV' within one TV line (i.e. no magnitude change due to $f_H/2$ dither occurs during the time interval encompassed by FIG. 3), and a portion 120 (shown in phantom) of CV' further modified by the ¼ LSB dither signal at the frequency $f_{sc}/2$. The peak-to-peak magnitude of this dither signal is ¼ LSB and is preferably introduced to modify signal portion 110 by alternately increasing and decreasing its amplitude by ⅛ LSB. As a result, the seven-bit digital samples DV further include additional transitions representative of ¼ LSB magnitude changes which can be averaged so as to produce, in conjunction with the $f_H/2$ dither, an apparent quantizing resolution approximating that of a nine-bit ADC.

The apparently increased quantizing resolution will become evident when the following analysis and tables are considered. Assume that the LSB of digital samples DV is equivalent to one unit of magnitude of analog signals CV and that the ADC quantizing window for analog value N which corresponds to digital value N is between the boundaries N−0.500 and N+0.4999. ... A standard ADC will produce, for example, the following table of correspondence:

TABLE I

| CV Analog Value | DV Binary Level | DV Decimal Equivalent |
|---|---|---|
| 0 | 00 | 0 |
| ½ | 01 | 1 |
| 1 | 01 | 1 |
| 1½ | 10 | 2 |
| 2 | 10 | 2 |
| 2½ | 11 | 3 |
| 3 | 11 | 3 | and so forth. For simplicity and clarity in the following tables, a narrower range of analog values are considered and the binary digital level column is omitted.

In accordance with the present invention, such ADC will produce, for example, the following table of correspondence in which "E" indicates an even-numbered TV line having +¼ LSB dither at $f_H/2$ and "O" indicates an odd-numbered line having −¼ LSB dither at $f_H/2$. In addition, "P" indicates +⅛LSB dither at $f_{sc}/2$ and "M" indicates −⅛ LSB dither at $f_{sc}/2$.

TABLE II

| CV Analog Value | $f_H/2$ Dither | $f_{sc}/2$ Dither | CV' Analog Value | DV Decimal Equivalent |
|---|---|---|---|---|
| 2 | E | P | 2⅜ | 2 |
|   | E | M | 2⅛ | 2 |
|   | O | P | 1⅞ | 2 |
|   | O | M | 1⅝ | 2 |
| 2¼ | E | P | 2⅝ | 3 |
|   | E | M | 2⅜ | 2 |
|   | O | P | 2⅛ | 2 |
|   | O | M | 1⅞ | 2 |
| 2½ | E | P | 2⅞ | 3 |
|   | E | M | 2⅝ | 3 |
|   | O | P | 2⅜ | 2 |
|   | O | M | 2⅛ | 2 |
| 2¾ | E | P | 3⅛ | 3 |
|   | E | M | 2⅞ | 3 |
|   | O | P | 2⅝ | 3 |

TABLE II-continued

| CV Analog Value | $f_H/2$ Dither | $f_{sc}/2$ Dither | CV' Analog Value | DV Decimal Equivalent |
| --- | --- | --- | --- | --- |
|   | O | M | $2\frac{3}{8}$ | 2 |
| 3 | E | P | $3\frac{3}{8}$ | 3 |
|   | E | M | $3\frac{1}{8}$ | 3 |
|   | O | P | $2\frac{7}{8}$ | 3 |
|   | O | M | $2\frac{5}{8}$ | 3 |

It is important to note that the average of the four DV decimal equivalent values produced by the ADC for a given CV analog value is exactly the given CV analog value from which they were, with two sources of dither, developed. Such averaging is produced in a TV receiver in several ways. For example, processors 16 and 18 can include digital lowpass filters which tend to electronically average the digital samples. By way of further example, the persistence of the kinescope phosphors and the viewers eye can average the perception of those signal values. For a chrominance component signal luminance level of $2\frac{1}{4}$, for example, the DV decimal equivalent values are displayed in a spatial pattern of the sort given in the following table:

TABLE III

| SAMPLES: | 1 | 2 | 3 | 4 | 5 | 6 | 7 | 8 |
| --- | --- | --- | --- | --- | --- | --- | --- | --- |
| LINES: |   |   |   |   |   |   |   |   |
| Even | 3 | 2 | 3 | 2 | 3 | 2 | 3 | 2 |
| Odd | 2 | 2 | 2 | 2 | 2 | 2 | 2 | 2 |
| Even | 3 | 2 | 3 | 2 | 3 | 2 | 3 | 2 |
| Odd | 2 | 2 | 2 | 2 | 2 | 2 | 2 | 2 |

Such patterns tend to be averaged by the viewer's eye and will not be apparent, particularly in a typical picture.

FIG. 4 shows an embodiment in which dither at the frequency $f_{sc}/2$ is additively introduced at node N through resistor RD1 and dither at the frequency $f_H/2$ is additively introduced at node N through resistor RD2. The resistances of RD1 and RD2 are selected in similar manner to that described above in relation to resistor RD. Inverter 22 is illustrative of an output circuit of processor 20 such as that of a flip flop. Inverter 22 includes P-channel field-effect transistor (FET) TP and N-channel FET TN connected in series between relatively positive voltage VDD and relatively negative voltage VSS. Clocking signal $f_{sc}/2$ is applied to their gates to cause FETs TP and TN to alternately conduct to switch the interconnection of their drains and RD1 to be at voltages VDD and VSS alternately. Inverter 24 is similar in structure to inverter 22 except that it couples clocking signal $f_H/2$ to RD2.

FIG. 5 shows an embodiment in which controlled current sources IS1 and IS2 are controllable in response to clocking signals $f_{sc}/2$ and $f_H/2$, respectively, to apply currents to node N which cooperate with the resistance RS to produce dithering signals such as those shown in FIGS. 2 and 3.

FIG. 6 shows an embodiment in which dithering signals are introduced to change the reference voltage levels of ADC 14, instead of changing the magnitude of the analog signals CV' as described above. It is important to note that the present invention encompasses embodiments having the effect of changing the relative magnitudes of the analog signals, the reference levels or both. A plurality of resistances of ADC 14 are connected in series to receive reference voltage VREF to develop a plurality of reference levels at their interconnections. Resistors $R_1, R_2, \ldots R_{P-1}$ have resistance value R and develop a voltage equivalent to that represented by one LSB of digital samples DV, which voltage determines the quantizing resolution.

The interconnections of these resistors $R_1, R_2 \ldots R_{P-1}$ are coupled to respective inputs of differential comparators C1, C2, C3 ... CP. Comparators C1, C2 ... CP have second inputs which receive the analog composite video signals CV' present at node N (note that these signals are not dithered in this embodiment). Resistor 80 has a resistance 5R/8 selected to center the anolog voltage boundaries corresponding to transitions between digital output levels to be offset by $\frac{1}{2}$ LSB, in cooperation with the dithering resistors 82, 84, 86 and 88. Such boundaries were described above in relation to Tables I, II and III.

Resistors 82 and 86 are alternatingly switched into and out of the resistor chain by opposing switches S1 and S2 which open and close in response to clocking signals $f_H/2$. Thus, at any given time, one of switches S1 and S2 is open and the other thereof is closed. Resistors 82 and 86 are selected to have resistance R/2 so that whichever one of them is not shorted by switches S1, S2 at any given time develops a voltage equivalent to $\frac{1}{2}$ LSB of digital samples DV, thereby to develop a $\frac{1}{2}$ LSB magnitude dithering change at the inputs of each comparator C1, C2, ... CP. Similarly, resistors 84 and 88 having resistances R/4 are alternately switched into and out of the resistor chain by opposing switches S3 and S4 in response to clocking signal $f_{sc}/2$ so as to develope a $\frac{1}{4}$ LSB magnitude dithering signal.

Modifications are contemplated to the present invention within the scope of the claims following. For example, other dithering frequencies and dithering magnitudes can be employed. The $f_H/2$ dither can be at $\frac{1}{4}$ LSB magnitude and the $f_{sc}/2$ dither can be at $\frac{1}{2}$ LSB magnitude. In addition, both dither frequencies can be developed in response to the same clocking signal so as to be related in frequency.

Further, other dither introducing embodiments can be employed. Inverter 22 of FIG. 4 can be replaced by a simple switch alternately connecting and disconnecting resistor RD1 from a single voltage level. Capacitors can be inserted, for example, in series with resistors RD1 and RD2 so as to AC couple the dithering signals to node N. Controllable current sources IS1 and IS2 of FIG. 5 may employ current mirror amplifiers and can either insert or withdraw currents from node N, or both.

The apparatus described herein including ADC 14, processors 16,18,20, DACs 30, 32, 34 and matrix 40 correspond, for example, to digital signal processing integrated circuits for television receivers available from ITT Semiconductors, Intermetall, Freiburg, West Germany and described in an ITT Semiconductors brochure entitled *VLSI Digital TV System DIGIT 2000*, dated August 1982, which is incorporated herein by reference. In addition, U.S. Pat. No. 4,352,123 describing a dithered ADC and digital luminance and chrominance processing is also incorporated herein by reference.

By way of further example, the present invention includes introduction of digital dithering signals to develop the apparent increase in quantiziang resolution described above. It is satisfactory that the correspondence between the magnitude of the digital samples and the magnitude of the analog signals they represent be changed by first and second amounts at first and second rates whether done in the analog or in the digital circuitry.

What is claimed is:

1. In a television receiver, apparatus for producing digital samples representative of the magnitude of analog composite video signals which have a line rate associated therewith and which include a reference frequency signal component, comprising:

a clocking source for providing sampling signals having a frequency related to that of said reference frequency signal component;

a reference source for providing a reference level signal;

converting means, coupled for receiving said composite video signals and coupled to said clocking and reference sources, for developing said digital samples in response to said sampling signals and said reference level signal;

first means, coupled to said converting means, for changing the magnitude of one of said composite video signals and said reference level signal at a first periodic rate substantially equal to one-half of said line rate, which changing the magnitude is by a first amount smaller than that represented by the least significant bit of said digital samples; and second means, coupled to said converting means for changing the magnitude of one of said composite video signals and said reference level signal at a second periodic rate substantially equal to one-half of the frequency of said reference frequency signal component, which changing the magnitude is by a second amount smaller than that represented by the least significant bit of said digital samples and different from said first amount.

2. The apparatus of claim 1 wherein:

said converting means includes a first resistance through which said composite video signals are coupled; and said first means comprises a first controllable current source coupled to said first resistance for applying a controlled current signal thereto at said first periodic rate for changing the magnitude of said analog signal by said first amount.

3. The apparatus of claim 2 wherein said second means comprises a second controllable current source coupled to said first resistance for applying a controlled current signal thereto at said second periodic rate for changing the magnitude of said analog signal by said second amount.

4. The apparatus of claim 1 wherein:

said converting means comprises a plurality of resistances serially connected to receive said reference level signal thereacross, a plurality of comparators having respective first and second inputs, means for coupling successive ones of said first inputs to successive interconnections of said plurality of resistances, and means for coupling said analog signals to said second inputs of said plurality of comparators; and said first means comprises first controllable switching means coupled to said converting means source for selectively providing a connection across one of said resistances, and means for controlling said first controllable switching means to provide said selective connection at said first periodic rate.

5. The apparatus of claim 4 wherein said second means comprises second controllable switching means coupled to said converting means for selectively providing a connection across a second of said resistances, and means for controlling said second controllable switching means to provide said selective connection at said second periodic rate.

6. The apparatus of claim 1 wherein said first amount is equivalent to approximately one-half the magnitude represented by said least significant bit and said second amount is equivalent to approximately one-quarter the magnitude represented thereby.

* * * * *

UNITED STATES PATENT AND TRADEMARK OFFICE
CERTIFICATE OF CORRECTION

PATENT NO. : 4,543,599
DATED : Sep. 24, 1985
INVENTOR(S) : D.H. Willis/R.T. Fling It is certified that error appears in the above-identified patent and that said Letters Patent is hereby corrected as shown below:

Column 2, line 41    "pule" should be --pulse--.

Column 3, line 18    before "Y'" insert --signals--.

Signed and Sealed this

Eleventh Day of February 1986

[SEAL]

Attest:

DONALD J. QUIGG

Attesting Officer     Commissioner of Patents and Trademarks